United States Patent [19]

Akeyoshi et al.

[11] Patent Number: 4,978,812

[45] Date of Patent: Dec. 18, 1990

[54] ELECTROMAGNETIC WAVE SHIELDING TRANSPARENT BODY

[75] Inventors: Kazuyuki Akeyoshi, Yamato; Takeshi Matsumoto, Yokohama; Satoru Harada, Yokohama; Masatake Nakamura, Tokyo; Toshiyuki Ishikawa, Ichikawa, all of Japan

[73] Assignee: Asahi Glass Company, Ltd., Tokyo, Japan

[21] Appl. No.: 288,278

[22] Filed: Dec. 22, 1988

[30] Foreign Application Priority Data

Dec. 25, 1987 [JP] Japan .................. 62-327397
Dec. 25, 1987 [JP] Japan .................. 62-327398
Dec. 25, 1987 [JP] Japan .................. 62-333514
Dec. 25, 1987 [JP] Japan .................. 62-333515
Dec. 25, 1987 [JP] Japan .................. 62-333516

[51] Int. Cl.$^5$ .............................. H05K 9/00
[52] U.S. Cl. .................................. 174/35 M S
[58] Field of Search .................. 174/35 M S; 52/171

[56] References Cited

U.S. PATENT DOCUMENTS

| | | | |
|---|---|---|---|
| 2,920,174 | 1/1960 | Haagensen | 219/10.55 |
| 2,958,754 | 11/1960 | Hahn | 174/35 M S |
| 3,177,334 | 4/1965 | Kinkle | 174/35 M S |
| 3,231,663 | 1/1966 | Schwartz | 174/35 M S |
| 3,265,804 | 8/1966 | Berger | 174/35 M S |
| 3,843,859 | 10/1974 | Klemp | 219/10.55 |
| 4,381,421 | 4/1983 | Coats et al. | 174/35 R |
| 4,613,530 | 9/1986 | Hood et al. | 52/171 X |
| 4,721,636 | 1/1988 | Hood et al. | 52/171 X |

FOREIGN PATENT DOCUMENTS

| | | |
|---|---|---|
| 3430406 | 3/1985 | Fed. Rep. of Germany . |
| 2436472 | 4/1980 | France . |
| 2484397 | 12/1981 | France . |
| 2064629 | 6/1981 | United Kingdom . |

Primary Examiner—H. Broome
Assistant Examiner—David A. Tone
Attorney, Agent, or Firm—Oblon, Spivak, McClelland, Maier & Neustadt

[57] ABSTRACT

An electromagnetic wave shielding transparent body comprising one or more transparent sheets, a transparent conductive layer formed as a first electric conductor on at least one of said transparent sheets, and a second electric conductor separated from said transparent conductive layer.

10 Claims, 8 Drawing Sheets

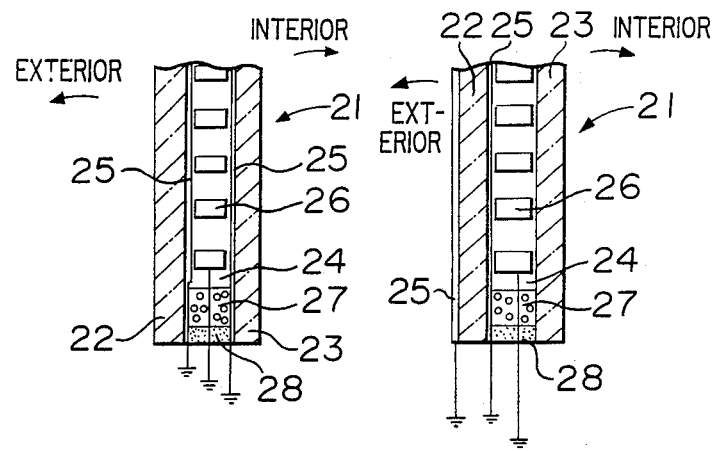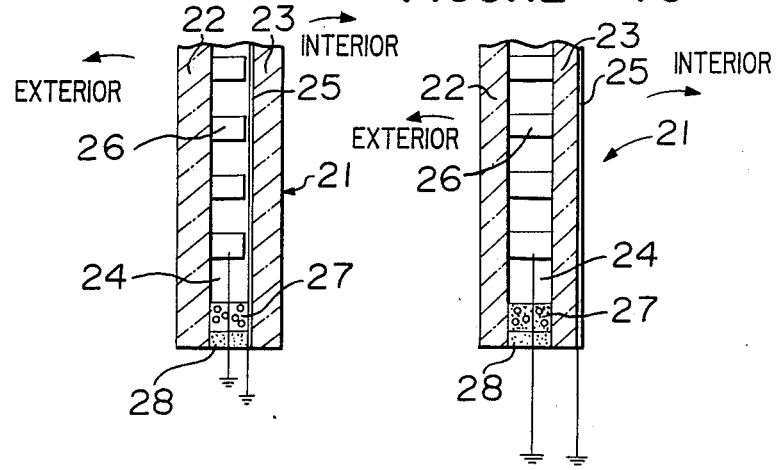

ELECTROMAGNETIC WAVE SHIELDING TRANSPARENT BODY

The present invention relates to an electromagnetic wave shielding transparent body having excellent electromagnetic wave shielding properties, which is suitable for application to windows or doors.

In recent years, noises due to electromagnetic waves have been a serious problem for buildings or various other structures. In order to overcome such a problem of noises due to electromagnetic waves, it has been desired to develop a technique to prevent external electromagnetic waves from entering into buildings so that electronic machines or equipments in the buildings will not be affected by the noises of the external electromagnetic waves and a technique to prevent leakage of electromagnetic waves from the interior of the buildings to the exterior so that the internal electromagnetic waves will not adversely affect other buildings. Such techniques to prevent the leakage of electromagnetic waves and to prevent the entrance of electromagnetic waves are required particularly for intelligent buildings wherein optical fiber cables, coaxial cables or information network systems for e.g. radio communications, are ramified, for computer centers or for buildings, offices or hospitals wherein high precision electronic equipments are used, with a view to preventing the generation of noises, erroneous operations or leakage of information, or with a view to the prevention of tapping of information. The necessity for such techniques is expected to increase even more in the future. Further, at a site where the electromagnetic environment is poor, e.g. at a site close to an electric train or to a high voltage transmission line, an electromagnetically shielded building is required to prevent the entrance of the electromagnetic waves.

When such buildings, various other structures or offices designed to prevent the entrance and leakage of electromagnetic waves, are to be constructed, it is usual that openings such as windows and doorways are located at sites where electromagnetic shielding effects are most required. Heretofore, however, the materials for openings such as windows or doorways, particularly the materials for windows and openings where transparency is required, such as glass, have had no electromagnetic wave shielding properties, and it was therefore impossible to shield electromagnetic waves at such openings. Heretofore, buildings having a high level of electromagnetic wave shielding properties were therefore windowless, whereby no sunlight entered, and did not provide a good working environment. When an electromagnetically shielded space is required in a usual building, it used to be required to construct a windowless electromagnetic wave shielding room. In such a case, the above-mentioned drawbacks exist. Under these circumstances, it has been desired to develop a transparent material such as glass which has a high electromagnetic wave shielding property and a sufficient transmittance of lights in the visible light range of sunlight.

Heretofore, window glass having a high level of an electromagnetic shielding property and transmittance of lights in the visible light range of sunlight, used to be such that a woven cloth made of fine filaments having a high level of an electromagnetic shielding property, such as a mesh cloth, was sandwiched by a pair of glass sheets, or such that a metal layer having a substantial thickness was bonded to a glass sheet. The former was unsatisfactory with respect to the electromagnetic shielding property and had a difficulty in the transmittance of lights in the visible light range of sunlight. The latter had a drawback that it had a serious problem in the transmittance of lights in the visible light range of sunlight.

It is therefore an object of the present invention to provide a transparent material such as a glass having a high electromagnetic shielding property and sufficient transmittance of lights in the visible light range of sunlight and being free from the above-mentioned drawbacks, particularly a transparent body suitable for use at openings such as windows or doorways of buildings, structures or rooms for shielding electromagnetic waves.

The present invention provides an electromagnetic wave shielding transparent body comprising one or more transparent sheets, a transparent conductive layer formed as a first electric conductor on at least one of said transparent sheets, and a second electric conductor separated from said transparent conductive layer.

Now, the present invention will be described in detail with reference to the preferred embodiments.

In the accompanying drawings:

FIGS. 12 to 16 are partially omitted cross sectional views of various electromagnetic wave shielding transparent bodies of the present invention having a highly conductive lattice provided as the second electric conductor of the present invention.

Figure 19A:
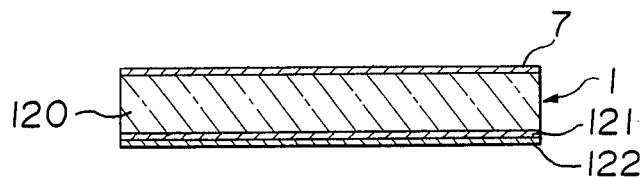
Figure 19B:
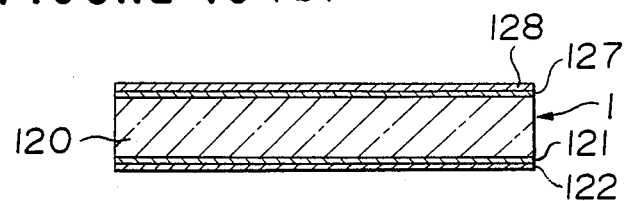

FIGS. 19(a) and 19(b) are cross sectional views of electromagnetic wave shielding transparent bodies of the present invention having filaments provided on the respective transparent conductive layers.

Figure 20A:
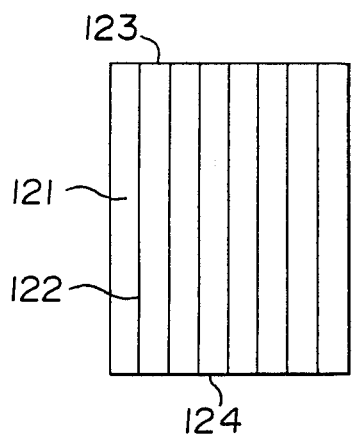
Figure 20B:
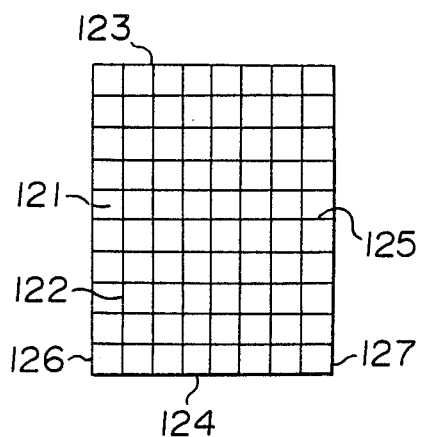

FIGS. 20(a) and 20(b) are plan views of electromagnetic wave shielding transparent bodies of the present invention having filaments provided on a transparent conductive layer as the first or second conductor.

FIGS. 21(a) to 21(f) are cross sectional views of transparent sheets having a color or reflectivity-adjusting layer formed on or under the first or second conductor.

Referring to the drawings, various embodiments of the present invention will be described.

FIGS. 1 to 5 are cross sectional views of various embodiments of the electromagnetic wave shielding transparent body of the present invention. In these Figures, reference numeral 1 indicates an electromagnetic wave shielding transparent body, numerals 2 and 4 indicate transparent sheets, numerals 5 and 6 indicate transparent conductive layers as the first electric conductor, numerals 7 and 8 indicate the second electric conductors, numeral 10 indicates an interlayer, numeral 11 indicates a spacer for a multi-glazed assembly, and numeral 12 indicates an inner space.

In the present invention, the transparent sheets may be transparent, translucent, colored transparent or colored translucent glass sheets, or various plastic sheets or films. Among them, glass sheets are preferred from the viewpoint of optical properties and durability. Otherwise, such a transparent sheet may be the one obtained by laminating one or more transparent sheets by means of an interlayer or an adhesive.

Figure 1:
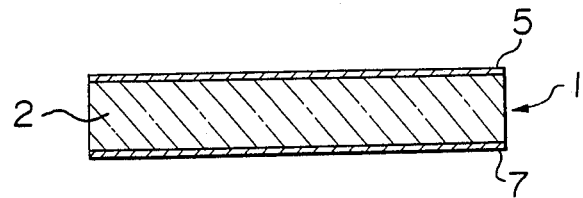
FIGS. 1 to 5 are cross sectional views of various embodiments of the electromagnetic wave shielding transparent body of the present invention.
Figure 2:
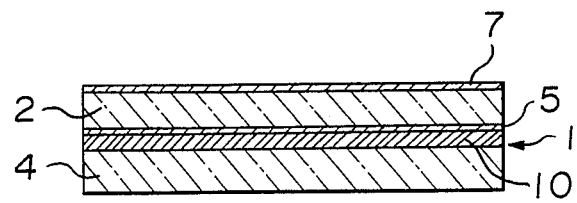
Figure 3:
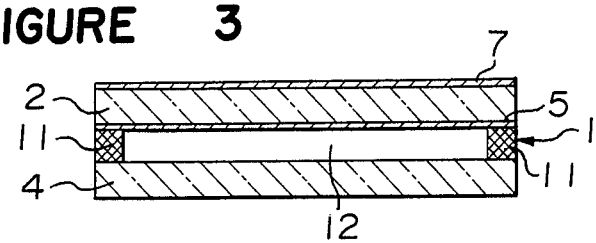
Figure 4:
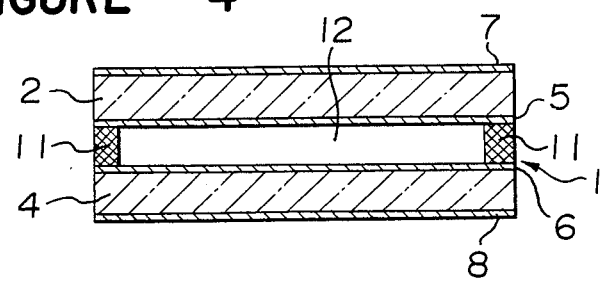
Figure 5:
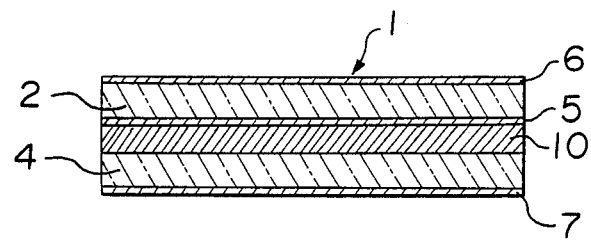
Figure 12:
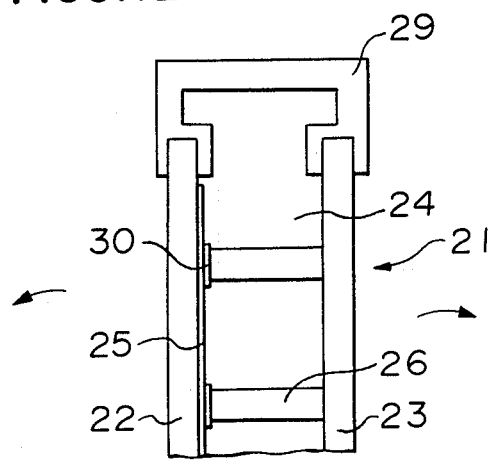

The transparent body of the present invention may be composed of a single transparent sheet 2 as shown in FIG. 1, or may be of a laminate type as shown in FIG. 2 wherein two transparent sheets 2 and 4 are bonded by an interlayer 10. Further, it may be of a double-layered type as shown in FIG. 3 or 4 wherein two transparent sheets 2 and 4 are spaced with a predetermined distance from each other by a spacer 11 so as to form an inner space 12, or of a double-sheet type as shown in FIG. 12 wherein two transparent sheets 22 and 23 are spaced with a predetermined distance from each other by a frame 29 so as to form an inner space 24. Otherwise, the transparent body of the present invention may be of a laminate type wherein three or more transparent sheets are bonded by interlayers, or of a multi-layered type wherein three or more transparent sheets are spaced by spacers, or of a multiple-sheet type wherein three or more transparent sheets are spaced from one another by a frame. In this specification, a "multi-glazed" assembly will be used as the word that includes both multi-layered type and multi-sheet type assembly.

The electromagnetic wave shielding transparent body of the present invention comprises a transparent conductive layer formed as a first electric conductor on at least one of the above-mentioned transparent sheets, and a second electric conductor separated from the transparent conductive layer.

In the present invention, the transparent conductive layer as the first electric conductor formed on a transparent sheet includes, for example, not only a transparent tin oxide conductive layer (a conductive layer of tin oxide doped with antimony or fluorine) and a transparent indium oxide conductive layer (a condutive layer of indium oxide doped with tin) but also a single-layered thin film type transparent layer of a metal or alloy of e.g. Cr, Ti, Ag, Au, Al, Cu or Ni, and a multi-layered thin film type layer having such a metal or alloy layer sandwiched between thin dielectric films of e.g. ZnO, $SnO_2$, $In_2O_3$, $TiO_2$, $Bi_2O_3$, $Ta_2O_5$, $WO_3$ or ZnS, for example, a three-layered type such as $TiO_2/Ag/TiO_2$, $ZnO/Ag/ZnO$, or $SnO_2/Ag/SnO_2$, and a five layered type such as $TiO_2/Ag/TiO_2/Ag/TiO_2$, or $ZnO/Ag/ZnO/Ag/ZnO$, as well as other layers of appropriate constructions. Each of these transparent conductive layers is made of a film having high heat ray reflectivity. If necessary, however, it is possible to employ a film having relatively low heat ray reflectivity. When the transparent conductive layer is made of a film having high heat ray reflectivity, it has a function to reduce the air conditioning load, and as such it can be used as a window material having good heat insulating properties.

The transparent conductive layer having the above described construction can be formed by an appropriate layer-forming method such as a vacuum vapor deposition method, a sputtering method, a CVD method, a spray method, a CLD method or a printing method. In such a case, the transparent conductive layer is preferably formed directly on a transparent sheet. However, it is, possible to employ as the transparent conductive layer a transparent conductive plastic film formed by laminating a transparent conductive layer on a plastic film such as a polyester film and to laminate such a transparent conductive plastic film on a transparent sheet.

The transparent conductive layer to be used in the present invention, preferably has a resistance of at most 20 $\Omega/\square$ to obtain a high level of electromagnetic wave shielding effects. Most preferably, the resistance is at most 10 $\Omega/\square$ so that the conductive layer is capable of effectively shielding electromagnetic waves within a wide frequency range of at least 40 MHz. The thickness of the transparent conductive layer is suitably selected so that the desired resistance and visible light transmittance as mentioned above will be obtained, or a desired color will be obtained.

Such a transparent conductive layer may be divided into two or more films, so that it may be composed of a plurality of transparent conductive films. In such a case, the distance between the respective transparent conductive films is preferably at most 1 cm to prevent leakage of electromagnetic waves. When a plurality of transparent conductive films are formed on one transparent sheet, the overall electric resistance of the plurality of transparent conductive films formed on the transparent sheet can be reduced by connecting them electrically in parallel, whereby the electromagnetic wave shielding performance can be improved.

Such a transparent conductive layer may be formed on the exposed surface of the transparent sheet as shown in FIG. 1, or in the case of a laminate type, it may be formed on the laminated surface of the transparent sheet as shown in FIG. 2. In the case of the double-glazed type, it may be formed on the inner space side of the transparent sheet(s) as shown in FIGS. 3 and 4. By forming the transparent conductive layer on the laminated surface or on the inner space side surface as mentioned above, it is possible to avoid exposure of the transparent conductive layer and to protect the transparent conductive layer, such being advantageous in the case of a transparent conductive layer having poor durability. It is of course possible to form the transparent conductive layer on the exposed surface even in the case of a laminate type, double- or multi-glazed type transparent sheet.

The transparent conductive layer as the first electric conductor may be formed on one side of a transparent sheet. If necessary, however, it may be formed on two or more surfaces. In each of the embodiments shown in FIGS. 1, 2 and 3, a transparent conductive layer 5 is formed on one side of a transparent sheet 2. In the embodiment shown in FIG. 5, transparent conductive layers 5 and 6 are formed on both sides of a transparent sheet 2. FIG. 4 shows an embodiment wherein transparent conductive layers 5 and 6 are formed on one side of the respective transparent sheets 2 and 4 of a double-layered assembly comprising two transparent sheets.

In the present invention, the second electric conductor provided for the purpose of complementing the electromagnetic wave shielding property of the first electric conductor, may be a transparent conductive layer or a conductive lattice pattern, or it may be a lattice made at least partially of an electrically highly conductive material. The transparent conductive layer or the conductive lattice pattern as the second conductor is preferably formed on at least one of 2n surfaces of one or plurality (n) transparent sheets constituting the transparent body of the present invention other than the surface(s) on which the above-mentioned transparent conductive layer as the first conductor is formed. Namely, it is preferred that the transparent conductive layer as the first conductor is formed on one of 2n surfaces of the transparent sheets, while the second electric conductor is formed on at least one of the rest of the 2n surfaces. In FIGS. 1 to 5, such second electric conductors are shown by reference numerals 7 and 8. The lattice made at least partly of a highly conductive material may be provided as the second electric conductor in an inner space formed between transparent sheets disposed to face one another with a space. Such a structure is illustrated in FIGS. 11 to 16.

Figure 6:
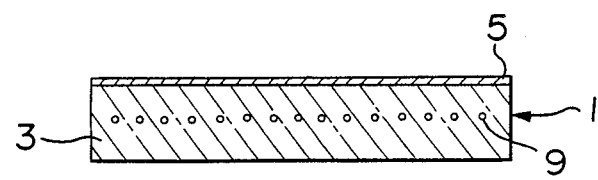
FIG. 6 is a cross sectional view of a glass sheet in which a metal wire is sealed in the form of a lattice, as an embodiment of a transparent sheet having a conductive lattice pattern formed as the second electric conductor of the present invention.

As the conductive lattice pattern formed on a transparent sheet constituting the transparent body of the present invention, a lattice pattern formed of a highly conductive material is employed so as to efficiently shield electromagnetic waves. Such a conductive lattice pattern may be the one formed by printing a conductive paste comprising a metal powder such as Ag, Al, Au or Cu and a binder, in a predetermined lattice pattern, followed by curing or baking, or the one formed by bonding an aluminum or nickel foil in a predetermined lattice pattern, or the one formed by bonding or sandwiching a plastic film on which or on an intermediate layer of which a lattice pattern made of a conductive metal is formed. As a transparent sheet having such a conductive lattice pattern formed therein, it is possible to use a glass sheet 3 in which a metal wire 9 is sealed in the form of a lattice pattern as shown in FIG. 6, or a plastic sheet having a metal wire net sealed therein. It is also possible to employ a transparent laminate wherein a metal wire is sandwiched in a lattice pattern between a pair of transparent sheets. It is also possible to prepare a lattice from an electrically highly conductive metal or alloy (such as Al, Cu, stainless steel or brass), or from other conductive material, or to prepare a lattice from a plastic material, and then form a coating layer of an electrically highly conductive metal or alloy, or other conductive material, on its surface, or to prepare a lattice from an electrically highly conductive metal or alloy, or other conductive material, and form a coating layer or insulating layer on its surface, and to paste, bond or otherwise fix such an lattice to a transparent sheet to form a lattice pattern. A lattice pattern described above may be formed on one surface of a transparent sheet. If necessary, it may be formed on two or more surfaces or inside of a transparent sheet.

There is no particular restriction as to the shape in the front view of each unit of the conductive lattice pattern. A polygonal pattern such as a triangular, rectangular, pentagonal or hexagonal pattern, or a pattern of any other optional shape, may be employed. The length (inner size) of the longer diagonal line of each lattice unit is determined taking into consideration the desired light transmittance, electromagnetic wave shielding properties, design, etc. Usually, it is preferable the length of the diagonal line is from 1 to 30 cm. If it exceeds 30 cm, the electromagnetic wave shielding properties in a low frequency region tend to decrease, such being undesirable. On the other hand, if it is shorter than 1 cm, the lattice pattern tends to be dense, such being undesirable from the viewpoint of seethrough and light transmitting properties.

By using an electrically highly conductive lattice pattern having the above described structure and dimensions, electromagnetic waves can effectively be shielded by repetition of reflection of electromagnetic waves at the respective lattices. Electromagnetic waves in a low frequency range such as electromagnetic waves of frequency of not more than 400 MHz can particularly effectively be shielded.

Figure 7:
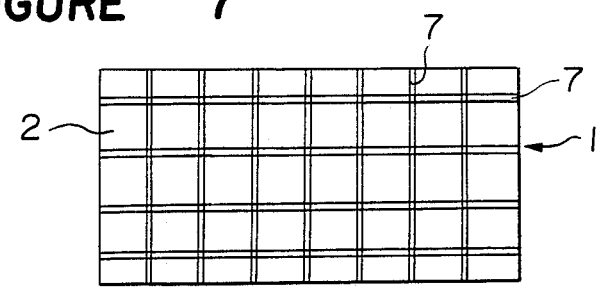
FIGS. 7 to 10 are plan views of electromagnetic wave shielding transparent bodies of the present invention having various conductive lattice patterns formed as the second electric conductor of the present invention.
Figure 9:
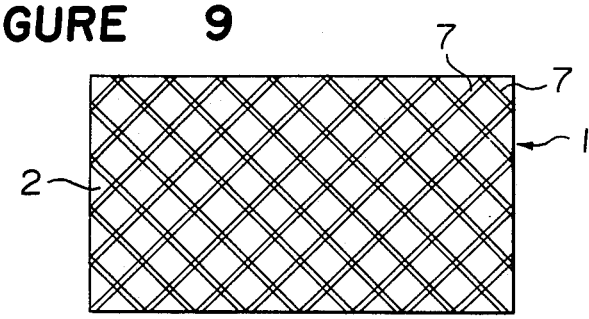

In the embodiments shown in FIGS. 7 and 9, a glass sheet was used as a transparent sheet, and a silver paste was printed on the surface of this glass plate in a lattice pattern with the shape of each lattice unit being square, followed by baking to form a conductive lattice pattern, whereby the length of the diagonal line of the rectangular lattice was adjusted to 10 cm, and the thickness of the lattice pattern was adjusted to 20 μm, and the width of the line was adjusted to 1 mm, so that electromagnetic waves of not higher than 400 MHz can effectively be shielded.

Figure 8:
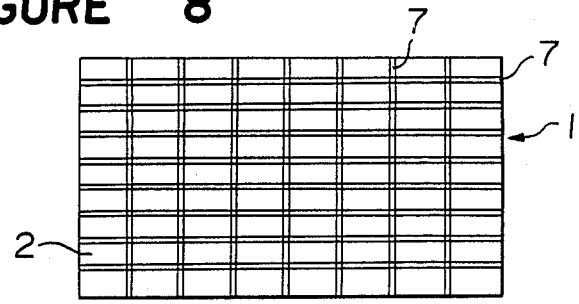

In the embodiment of FIG. 8, a glass sheet was used as the transparent sheet, and a silver paste was printed on this glass sheet in a lattice pattern wherein the shape of the lattice unit was rectangular, followed by baking to form an conductive lattice pattern, whereby the diagonal lie of the rectangular lattice was adjusted to 20 cm, the thickness of the lattice pattern was adjusted to 20 μm and the width of the line was adjusted to 1 mm, so that electromagnetic waves of not more than 300 MHz can effectively be shielded.

Figure 10:
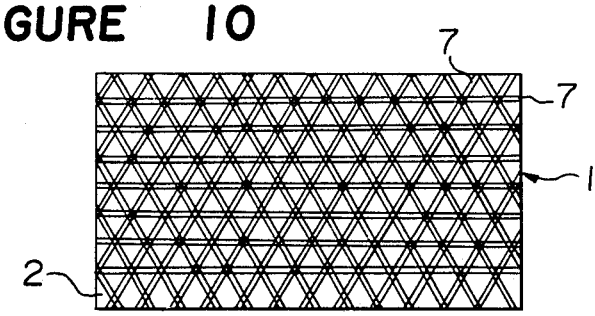

In the embodiment of FIG. 10, a glass sheet was used as the transparent sheet, and a silver paste was printed on this glass sheet in a lattice pattern wherein the shape of the lattice unit was triangular, followed by baking to form an conductive lattice pattern, whereby the length of the height of the triangular lattice was adjusted to 10 cm, the thickness of the lattice pattern was adjusted to 20 μm and the width of the line was adjusted to 1 mm, so that electromagnetic waves of not more than 400 MHz can effectively be shielded.

Figure 11:
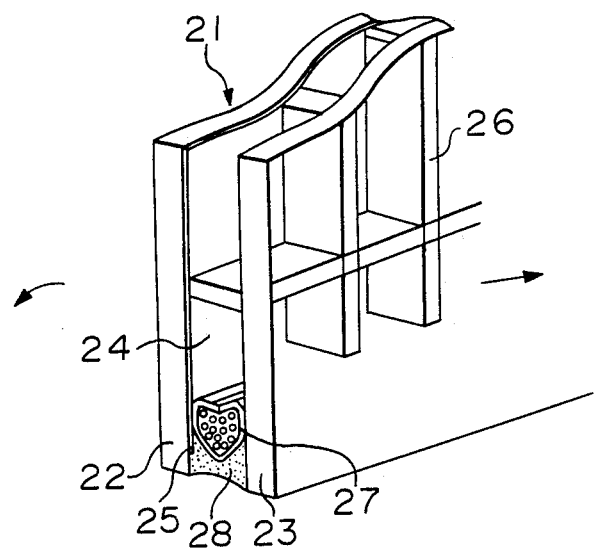
FIG. 11 is a partially omitted diagrammatical illustration of an electromagnetic wave shielding transparent body of the present invention having a highly conductive lattice provided as the second electric conductor of the present invention in an inner space of a multi-layered transparent assembly.

FIG. 11 is a partially omitted diagrammatical illustration of an electromagnetic wave shielding transparent body of the present invention, wherein a highly conductive lattice as the second electric conductor of the present invention is provided in an inner space of a double-glazed transparent assembly. In this Figure, reference numeral 21 indicates a doublelayered transparent body, numerals 22 and 23 indicate transparent sheets, numeral 24 indicates an inner space, numeral 25 indicates a transparent conductive layer, and numeral 26 indicates an electrically highly conductive lattice. The double-glazed transparent body 21 is prepared by disposing a pair of transparent sheets 22 and 23 in parallel to each other with a predetermined space by a drying agent-containing spacer 27 disposed along the periphery of the transparent sheets and sealing them with sealant 28 along the peripheral portion to form an inner space 24 between the two transparent sheets 22 and 23.

As the lattice to be provided in the inner space of the double-glazed transparent body, as the second electric conductor of the present invention, an electrically high conductive lattice is employed in order to shield electromagneic waves. This electrically highly conductive lattice may be the one wherein the lattice is made of an electrically highly conductive metal or alloy (such as Al, Cu, stainless steel or brass), or other conductive material, or the one wherein the lattice is made of a plastic or insulating material and a coating layer of an electrically high conductive metal or alloy, or other conductive material, is formed on its surface, or the one in which a lattice is made of an electrically high conductive metal or alloy, or other conductive material, and a coating layer or an insulating layer is provided on its surface. There is no particular restriction as to the shape in the front view of each lattice unit of this lattice. The shape may be triangular, rectangular, pentagonal, hexagonal or any other optional shape. The length (the inner size) of the longer diagonal line of each lattice unit is determined taking into consideration the desired light transmittance, electromagnetic wave shielding properties, design, etc. The length of the diagonal line is usually from 1 to 30 cm. If it exceeds 30 cm, the electromagnetic wave shielding properties in a low frequency region tend to be low, such being undesirable. On the other hand, if it is shorter than 1 cm, the lattice pattern tends to be dense, such being undesirable from the viewpoint of see-through and light transmitting properties.

By using an electrically highly conductive lattice having the above described structure and dimensions, electromagnetic waves can effectively be shielded by repetition of reflectance of electromagnetic waves at the respective lattice surfaces. Electromagnetic waves in a low frequency range, such as electromagnetic waves of frequency of not more than 400 MHz can particularly effectively be shielded.

FIG. 11 illustrates an embodiment wherein an aluminum metal lattice is used wherein the shape of each lattice unit is square, whereby the length of the diagonal line is adjusted to from 5 to 15 cm so that electromagnetic waves of not more than 400 MHz can be shielded.

In the electromagnetic wave shielding transparent body of the present invention, the transparent conductive layer as the first electric conductor, and the second electric conductor can be in a conductive state. However, in the case where the second electric conductor is a conductive lattice pattern or an electrically highly conductive lattice, it is preferred that the transparent conductive layer and the conductive lattice pattern or lattice are in a non-conductive state, so that the transparent conductive layer is capable of effectively shielding electromagnetic waves in a high frequency reqion (e.g. from 100 to 1,000 MHz), while the lattice pattern or lattice is capable of effectively shielding electromagnetic waves in a low frequency region (e.g. not more than 400 MHz).

When the second electric conductor is a conductive lattice pattern, the transparent conductive layer and the conductive lattice pattern may be formed on different surfaces of a transparent sheet as mentioned above so that they are in a non-conductive state to each other. Otherwise, an electric insulating layer may be provided between the transparent conductive layer and the electrically highly conductive lattice at least at the portion where the two are otherwise in contact with each other, so that they are in a non-conductive state to each other.

In a particularly preferred embodiment, a transparent conductive layer and a conductive lattice pattern are separately provided on different surfaces of a transparent body. In this manner, a high electromagnetic wave shielding effect can be obtained within a wide frequency range due to the synergistic effects of the electromagnetic wave shielding properties of the transparent conductive layer and the conductive lattice pattern. When the second electric conductor is an electrically highly conductive lattice, it is preferred that the transparent conductive layer and the electrically highly conductive lattice are made to be in a non-conductive state at least at the central portion of the transparent sheet on which the transparent conductive layer is formed. In this case, the transparent conductive layer and the electrically highly conductive lattice may be in a conductive state along the periphery of the transparent sheet. In order to make the transparent conductive layer and the electrically highly conductive lattice to be in a non-conductive state, an electric insulating layer 30 may be formed at the portion where the two are otherwise in contact with each other, as shown in FIG. 12, or the two may be disposed with a space so that they are in a non-conductive state. Otherwise, the two may be made to be non-conductive by selecting the surface on which the transparent conductive layer is formed so that such a surface is not in contact with the electrically highly conductive lattice.

At least one of the transparent conductive layer as the first electric conductor and the electrically conductive lattice pattern or lattice as the second electric conductor may be provided with a terminal for earthing so that the electromagnetic waves thereby caught are earthed, whereby the electromagnetic wave shielding effect is obtained. When the transparent conductive layer and the lattice patten are in a non-conductive state, a terminal for earthing is provided to each of them. When they are in a conductive state, the earthing terminal may be provided to one of them or each of them. In the transparent conductive layer and/or the lattice pattern, a conductive paste containing a conductive metal powder such as Ag or Al is printed along an appropriate peripheral portion of the transparent conductive layer in a predetermined pattern, followed by baking or curing to form a busbar, or an aluminum foil or a copper foil in a predetermined pattern is bonded to form a busbar, and an earthing terminal is provided at an appropriate position of such a busbar. To this earthing terminal, a terminal block may be attached to facilitate the connection with an earthing line, as the case requires. Such an earthing terminal may be provided at one position or at a plurality of positions.

Figure 17:
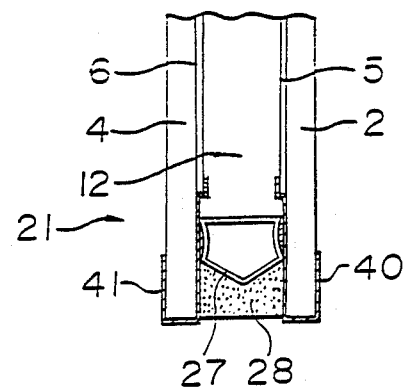
FIGS. 17 and 18 are partially omitted cross sectional views illustrating different embodiments of the earth connection of electromagnetic wave shielding transprarent bodies of the present invention.

FIG. 17 illustrates an embodiment in which an electromagnetic wave shielding transparent body 21 of the present invention comprises transparent sheets 2 and 4 disposed with a predetermined space in parallel to each other by a spacer 27 to form an inner space 12 and sealed along their periphery with a sealant 28 and first and second electric conductors 5 and 6 formed on the inner space sides of the transparent sheets 2 and 4, wherein aluminum tapes 40 and 42 are provided to contact the electric conductors 5 and 6, respectively, and extend to the exterior of the transparent body, so that they may be earthed.

The transparent conductive layer and/or the lattice pattern may not necessarily be provided with an earthing terminal. For example, when the transparent sheet is attached to a window frame, predetermined portions of the transparent conductive layer and/or the lattice pattern are exposed, and a conductive sealant is provided along the exposed portions of the transparent conductive layer and/or the lattice pattern, so that the conductive sealant is utilized for the condution with the window frame.

Figure 18:
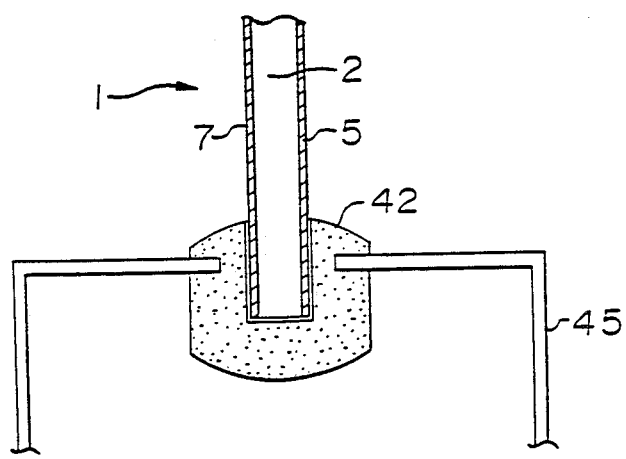

FIG. 18 illustrates an embodiment wherein the electromagnetic wave shielding transparent body 1 of the present invention comprises a transparent sheet 2 and the first and second electric conductors 5 and 7 provided on the opposite surfaces of the transparent sheet 2, wherein a conductive sealant 42 is provided to contact with the electric conductors 5 and 7 and with a window frame 45, and the electric conductors 5 and 7 are thereby earthed.

In the case of an electrically conductive lattice, an earthing terminal may be provided directly or by means of a terminal block at an appropriate position or positions along the lattice. The earthing terminal may be provided at one position or at a plurality of positions.

FIGS. 13 to 16 are cross sectional views of double-glazed transparent bodies having a transparent conductive layer 25 and an electrically highly conductive lattice 26, as other embodiments of the present invention. FIG. 13 illustrates an embodiment wherein a transparent conductive layer 25 is formed on the inner space 24 side of each of transparent sheets 22 and 23, and the two transparent conductive layers 25 and the lattice 26 are earthed respectively.

FIG. 14 illustrates an embodiment wherein a transparent conductive layer 25 is formed on each side of the exterior transparent sheet 22, and the two transparent conductive layers 25 and the lattice 26 are earthed respectively.

FIG. 15 is an embodiment wherein a transparent conductive layer 25 is formed in the inner space 24 side of the interior transparent sheet 23, and the transparent conductive layer 25 and the lattice 26 are earthed respectively.

FIG. 16 is an embodiment wherein a transparent conductive layer 25 is formed on the interior side of the interior transparent sheet 23, and the transparent conductive layer 25 and the lattice are earthed respectively.

The electromagnetic wave shielding effect is inversely proportional to the electric resistance of the electromagnetic wave shielding layer. If the layer is made thick, the electromagnetic shileding effect can be increased, but the transmittance of sunlight tends to be low. In order to maintain the transmittance of sunlight to some extent, it is necessary to make the layer thin. Therefore, the transparent conductive layer as the first or second electric conductor may be composed of a thin transparent conductive layer and conductive filaments formed thereon or therebeneath in contact therewith, so that the overall resistance can be made low. For example, FIG. 19(a) illustrates the structure of an electromagnetic shielding transparent body of the present invention in which a transparent condutive layer 121 as the first electric conductor is formed on one side of a transparent sheet 120 and conductive filaments 122 are formed thereon to reduce the resistance of the transparent conductive layer 121, and the second electric conductor 7 is formed on the opposite side. FIG. 19(b) illustrates an embodiment wherein transparent conductive layers 121 and 127 as the first and second electric conductors are formed on the opposite sides of a transparent sheet 120, and conductive filaments 122 and 128 are formed on the respective transparent conductive layers 121 and 127. In a specific example as shown in FIG. 20(a), the transparent conductive layer 121 is made thin to secure the light transmittance, and at the same time, conductive filaments 122 made of an electrically highly conductive material such as copper or silver are provided on the transparent conductive layer 121 in a fashion to divide the conductive layer surface, and each conductive filament 122 is connected to electrodes 123 and 124, whereby the surface resistance of the transparent conductive layer 121 can be made lower since the surface resistance is governed by the distance to the nearest filament, and thus, the electromagnetic shielding property can be improved. FIG. 20(b) illustrates an embodiment wherein in addition to conductive filaments 122 for longitudinal division, conductive filaments 125 for transverse division are provided to divide the surface of the transparent conductive layer 121 in a mesh pattern, and the filaments 122 and 125 are connected to electrodes 123 and 124 and electrodes 126 and 127, respectively. The conductive filaments 122 and 125 are intended to reduce the resistance of the transparent conductive layer rather than to perform a role of shielding electromagnetic waves as an electromagnetic wave shielding lattice. Therefore, they may not necessarily be disposed as densely as the electromagnetic wave shielding mesh or lattice, whereby the electromagnetic wave shielding property can be improved without reducing the transmittance of sunlight by the transparent conductive layer.

The conductive filaments may be formed in a pattern similar to the conductive lattice pattern as the above-mentioned second electric conductor.

The conductive filaments may be formed on or under the transparent conductive layer. However, if a transparent conductive layer is formed on the filaments, the properties of the transparent conductive layer at the overlapping portions are likely to deteriorate. Therefore, it is preferred that the filaments are formed on the transparent conductive layer. Further, a three or more layered laminate may be formed by laminating such filaments and transparent conductive layers.

The conductive filaments and electrodes may be provided with the same compositions in the same manner as the above-mentioned conductive lattice pattern as the second electric conductor, or may be a foil, wire, rod or sheet of highly conductive metal such as silver, copper, aluminum or nickel. Otherwise, they may be conductive particles or conductive patterns which are electrically connected in the form of filaments. A plurality of such filaments provided to divide the transparent conductive layer surface, preferably have a resistance lower than the transparent conductive layer so as to effectively reduce the resistance of the transparent conductive layer. The distance between the plurality of filaments is preferably from 1 to 20 cm, although there is no particular restriction as to such a distance.

An electromagnetic wave shielding transparent body having a transparent conductive layer of a metal or a metal oxide, or a laminate thereof, coated on the surface of a transparent body made of e.g. glass, may have various colors and reflecting colors depending upon the type and amount of the coating metal or metal oxide, or a laminate thereof, the thickness of the transparent conductive layer and the stabilizing treatment. Thus, the transparency, the light transmittance and the reflectance of the original transparent body substantially change. If it is used in such a state for windows of a building, the living environment in the interior may be poor and the appearance may not meet the intended design of the building, although the function as an electromagnetically shielded building may be obtained. In such a case, it is possible to adjust the color and the reflectivity to meet the desired design of the building. Such examples are illustrated in FIGS. 21(a) to (f).

Figure 21A:
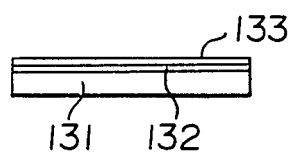
Figure 21B:
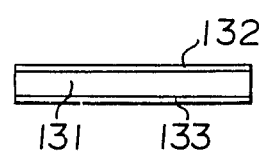
Figure 21C:
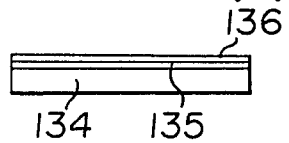
Figure 21D:
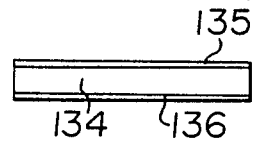
Figure 21E:
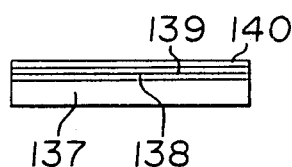
Figure 21F:
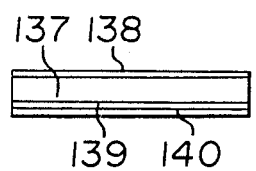

FIG. 21(a) illustrates an embodiment in which an electric conductor 132 such as a transparent conductive layer is formed on a transparent glass 131, and a color or reflectivity-adjusting layer 133 is formed thereon. FIG. 21(b) illustrates an embodiment wherein a color or reflectivity-adjusting layer 133 is provided on the opposite side of the electric conductor 132. FIGS. 21(c) and (d) illustrate embodiments wherein a heat ray absorbing glass 134 is used instead of the transparent glass 131 of FIGS. 21(a) and (b). Likewise, FIGS. 21(e) and (f) illustrate embodiments in which a heat ray reflective glass comprising a glass 137 and a reflective layer 138 is employed instead of the transparent glass 131 of FIGS. 21(a) and (b). The heat ray absorbing glass 134 is the one obtained by adding a very small amount of a metal oxide of e.g. nickel, chromium, cobalt or iron, or selenium, etc. to a soda lime silicate glass and thus is a colored glass. Accordingly, in the embodiments of FIGS. 21(c) and (d), the color or reflectivity adjusting layer 136 may be omitted. Likewise, the heat ray reflective glass has a thin layer of a highly heat ray reflective metal or metal oxide coated by a special method on one side of a transparent body and thus has a special color due to a mirror effect. Accordingly, in the embodiments of FIGS. 21(e) and (f), the color or reflectivity-adjusting layer 140 may be omitted.

An electromagnetic wave shielding transparent body having a desired color may be obtained by constructing the electromagnetic wave shielding transparent body of the present invention by using an appropriate transparent sheet as illustrated in one of FIGS. 21(a) to (f).

When the reflectivity is to be increased, a layer-forming material having a high chemical and physical durability and a refractive index higher than the transparent sheet, such as a high refractive index layer of $TiO_2$, ZnO, $Al_2O_3$ or $ZrO_2$ may be used as the color or reflectivity-adjusting layer. Likewise, when the reflectivity is to be increased and the color is to be adjusted by an absorbed color, a high refractive index and absorptive layer of e.g. Ag, SUS, Ni, Co, Au, or $TiN_x$ may be used. When a color or reflectivity-adjusting layer of such type is to be provided to a transparent sheet to obtain an electromagnetic wave shielding transparent body, for example, the above-mentioned high refractive index layer or high refractive index and absorptive layer is formed on the transparent sheet and an electric conductor is formed thereon, or an electric conductor is formed on the transparent sheet and the high refractive index layer or high refractive and absorptive layer is formed thereon, or the high refractive index layer or high refractive and absorptive layer is formed on the transparent sheet and a low refractive index layer having a refractive index lower than the transparent sheet, such as $SiO_2$, is formed thereon and an electric conductor is formed on the low refractive index layer. Further, if necessary, a high refractive index layer may be formed on the electric conductor to obtain an electromagnetic wave shielding transparent body of the present invention. Of course, the layered construction is not limited to the above examples, and various other constructions may be employed.

In many cases, the electric conductor is provided with an earthing terminal or a terminal block for earthing the electromagnetic waves. Therefore, in a case where the color or reflectivity-adjusting layer is electrically insulating, it is preferred that the electric conductor is provided as the outermost layer i.e. the exposed surface to facilitate the provision of such a terminal or terminal block.

A layer having other function such as a protective layer for improving the durability may be formed in combination with the electric conductor and the color or reflectivity-adjusting layer.

The present invention is by no means restricted to the above described embodiments, and various modifications are possible within the scope of the present invention. For example, the above-mentioned first and second conductors may be formed by laminating the transparent conductive layers and the conductive lattice patterns in three or more layers. Further, an electromagnetic wave shielding transparent body may be constructed by laminating and/or combining a plurality of the above described electromagnetic wave shielding transparent bodies.

In the electromagnetic wave shielding transparent body of the present invention, the first and second electric conductors are disposed with a distance. Thus, even when it is impossible to obtain an adequate electromagnetic wave shielding effect by one electric conductor alone, the electromagnetic wave shielding effect can be enhanced or complemented by another electric conductor. For example, the transparent conductive layer as the first electric conductor is rather poor in the electromagnetic wave shielding performance in a low frequency range, but excellent in the high frequency range, whereas the lattice or lattice pattern as the second conductor is excellent in the electromagnetic shielding performance in a low frequency range, but rather poor in the high frequency range. Further, the performance varies also depending upon the type of the materials used. Accordingly, the electromagnetic wave shielding performance can further be improved by disposing electric conductors having different electromagnetic wave shielding properties, or by adjusting the distance between the conductors depending upon their electromagnetic wave shielding properties or upon the frequency to be shielded so that the reflection, absorption and/or resonance can effectively be conducted between the electric conductors.

Thus, in the present invention, when a transparent conductive layer as the first electric conductor and a conductive lattice pattern and/or an electrically highly conductive lattice as the second electric conductor are formed on a transparent sheet, a high electromagnetic wave shielding effect can be obtained while maintaining adequate light transmittance by the combined effects of the transparent conductive layer and the conductive lattice pattern and/or lattice. In particular, the transparent conductive layer is highly effective for shielding high frequency electromagnetic waves of at least 300 MHz, whereas the electrically highly conductive lattice pattern and/or lattice is highly effective for shielding low frequency electromagnetic waves of not higher than 400 MHz. Therefore, by the combination of the transparent conductive layer and the lattice pattern and/or lattice, it is possible to effectively shield a wide range of electromagnetic waves of e.g. from 10 to 1,000 MHz including electromagnetic waves in a frequency range emitted from computers, word processors, meters, robots or various other electronic equipments wherein digital technologies are used, and electromagnetic waves in a frequency range which cause erroneous operations or adverse effects to such various electronic equipments or information networks.

An electromagnetic wave shielding multi-glazed transparent body of the present invention wherein the first and second conductors are formed on a transparent body which is multi-glazed with a plurality of transparent sheets, has transparency and is sealed along the periphery of the transparent sheets to form an inner space, whereby not only the sound insulating effect is high, but also the heat insulating effect is high, and during the winter time, it is possible to save the heating energy, and during the summer time, it is possible to prevent the entrance of heat from outdoors and the load for air conditioning can be reduced. Further, the transparent conductive layer usually has an infrared reflectivity. By utilizing this property, it is possible to prevent the entrance of heat rays of sunlight into rooms during the summer time, and it is possible to prevent the flow out of the indoor heat during the winter time, thus being useful as a multi functional glass.

Further, when the transparent conductive layer as the first or second electric conductor is composed of a transparent conductive layer and conductive filaments formed thereon or therebeneath, the resistance of the transparent conductive layer can be reduced, whereby it is possible to obtain a high electromagnetic wave shielding effect while the entire light transmittance can be improved by making the transparent conductive layer thin.

The electromagnetic wave shielding transparent body of the present invention is useful as window glass for intelligent buildings or computer centers where transparency and light transmittance are required and a high level of electromagnetic wave shielding performance is required, or for buildings, offices, hospitals or various other structures wherein precision electronic equipments are used.

Further, when a color or reflectivity-adjusting layer is provided in the present invention, the color of the electromagnetic wave shielding transparent body can be adjusted as desired, and it is possible to provide an electromagnetic wave shielding window having a color matched with the design of the building.

What is claimed is:

1. An electromagnetic wave shielding transparent body comprising one or more transparent sheets, a transparent conductive layer formed as a first electric conductor on at least one of said transparent sheets, and a second electric conductor separated from said transparent conductive layer wherein the second electric conductor has an electromagnetic shielding property complementary to the electromagnetic shielding property of the first electric conductor; and further wherein the second electric conductor is in the form of a lattice pattern; and wherein said lattice is formed in a polygonal pattern in which the length of the longer diagonal line of each lattice unit is greater than or equal to 1 cm.

2. The electromagnetic wave shielding transparent body according to claim 1, wherein the transparent conductive layer is formed on one surface of a transparent sheet and the second electric conductor is formed on the other surface thereof.

3. The electromagnetic wave shielding transparent body according to claim 1, wherein plural (n) transparent sheets are disposed to face one another with a space so as to form a multi-glazed transparent assembly having an inner space between said transparent sheets, wherein the transparent conductive layer is formed on one of 2n surfaces of the transparent sheets of the multi-glazed transparent assembly, while the second electric conductor is formed on at least one of the rest of the 2n surfaces.

4. The electromagnetic wave shielding transparent body according to claim 1, wherein plural (n) transparent sheets are laminated, and the transparent conductive layer is formed on one of 2n surfaces of the transparent sheets, while the second electric conductor is formed on at least one of the rest of the 2n surfaces.

5. The electromagnetic wave shielding transparent body according to claim 1, wherein plural (n) transparent sheets are disposed to face one another with a space so as to form a multi glazed transparent assembly having an inner space between said transparent sheets, wherein the transparent conductive layer is formed on at least one of said transparent sheets, and a lattice made at least partly of conductive material is provided as the second electric conductor in the inner space.

6. The electromagnetic wave shielding transparent body according to claim 1, wherein said one transparent sheet is a laminate of plural transparent sheets.

7. The electromagnetic wave shielding transparent body according to claim 1, wherein the transparent conductive layer and the second electric conductor are in a nonconductive state to each other.

8. The electromagnetic wave shielding transparent body according to claim 1, wherein the transparent conductive layer comprises a transparent conductive film and conductive filaments provided in contact therewith.

9. The electromagnetic wave shielding transparent body according to claim 1, wherein at least one of the first and second electric conductors is earthed.

10. The electromagnetic wave shielding transparent body according to claim 1, wherein the first electric conductor is capable of shielding high frequency electromagnetic waves having a frequency of at least 300 MHz, while the second electric conductor is capable of shielding low frequency electromagnetic waves having a frequency of not higher than 400 MHz.

* * * * *